(12) United States Patent
Lin et al.

(10) Patent No.: US 12,484,269 B2
(45) Date of Patent: Nov. 25, 2025

(54) SEMICONDUCTOR STRUCTURE (71) Applicant: GlobalWafers Co., Ltd., Hsinchu (TW)

(72) Inventors: Po Jung Lin, Hsinchu (TW); Ying-Ru Shih, Hsinchu (TW); Chenghan Tsao, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 503 days.

(21) Appl. No.: 17/970,608

(22) Filed: Oct. 21, 2022

(65) Prior Publication Data
US 2023/0215925 A1    Jul. 6, 2023

(30) Foreign Application Priority Data
Jan. 3, 2022 (TW) .................... 111100021

(51) Int. Cl.
*H10D 62/00* (2025.01)
*H10D 62/57* (2025.01)
*H10D 62/85* (2025.01)

(52) U.S. Cl.
CPC ......... *H10D 62/57* (2025.01); *H10D 62/8503* (2025.01)

(58) Field of Classification Search
CPC ......... H10D 62/8503; H01L 21/02458; H01L 21/02491; H01L 21/02505; H01L 21/02581
See application file for complete search history.

(56) References Cited

U.S. PATENT DOCUMENTS

| | | | |
|---|---|---|---|
| 9,082,890 B1 | 7/2015 | Hanser et al. | |
| 9,761,672 B1 | 9/2017 | Nelson et al. | |
| 9,917,156 B1 | 3/2018 | Laboutin et al. | |
| 2012/0153440 A1* | 6/2012 | Ikuta | H10D 30/0612 257/E29.105 |
| 2021/0273057 A1* | 9/2021 | Hikosaka | H01L 21/02389 |

FOREIGN PATENT DOCUMENTS

| | | |
|---|---|---|
| CN | 102304760 | 1/2012 |
| CN | 106531614 | 3/2017 |
| CN | 107195732 | 9/2017 |
| JP | 2010182872 | 8/2010 |
| JP | 2010182872 A * | 8/2010 |

(Continued)

OTHER PUBLICATIONS

"Office Action of Japan Counterpart Application", issued on Apr. 2, 2024, p. 1-p. 6.

(Continued)

*Primary Examiner* — Reema Patel
(74) *Attorney, Agent, or Firm* — JCIPRNET (57) ABSTRACT

A semiconductor structure, including a substrate, a first nitride layer, a polarity inversion layer, a second nitride layer, and a third nitride layer, is provided. The first nitride layer is located on the substrate. The polarity inversion layer is located on a surface of the first nitride layer to convert a non-metallic polarity surface of the first nitride layer into a metallic polarity surface. The second nitride layer is located on the polarity inversion layer. The third nitride layer is located on the second nitride layer. The substrate, the first nitride layer, the polarity inversion layer, and the second nitride layer include iron element.

14 Claims, 5 Drawing Sheets

(56) References Cited

FOREIGN PATENT DOCUMENTS

| JP | 2015201574 | 11/2015 |
|----|------------|---------|
| JP | 2021134122 | 9/2021 |
| TW | 202025486 | 7/2020 |
| WO | 2011016219 | 2/2011 |
| WO | 2019156121 | 8/2019 |

OTHER PUBLICATIONS

Mun-Do Park et al., "Single-crystal GaN growth and polarity control using an E-beam evaporated aluminum layer", Optical Materials Express, Apr. 1, 2021, pp. 1-11.

* cited by examiner

SEMICONDUCTOR STRUCTURE

CROSS-REFERENCE TO RELATED APPLICATION

This application claims the priority benefit of Taiwan application serial no. 111100021, filed on Jan. 3, 2022. The entirety of the above-mentioned patent application is hereby incorporated by reference herein and made a part of this specification.

BACKGROUND

Technical Field

The disclosure relates to a semiconductor structure, and in particular to a semiconductor structure including iron element.

Description of Related Art

The gallium nitride (GaN) element has the advantages of high frequency and high power.

In the application of high frequency power elements, the resistivity of the silicon substrate used in GaN on Si is relatively high, so it is easy to cause insertion loss of high frequency characteristics of the elements in the silicon substrate due to the generation of a parasitic channel. In order to suppress the insertion loss, a silicon nitride layer or a deep-level dopant is usually used to suppress the insertion loss. However, the presence of the silicon nitride layer easily causes the issue that the GaN epitaxial layer cannot be flatly grown. In addition, excessive deep-level dopants cause the GaN epitaxial surface to be rough, thereby destroying the epitaxial quality of GaN.

SUMMARY

The disclosure provides a semiconductor structure, which can suppress the generation of a parasitic channel.

The disclosure provides a semiconductor structure, which includes a substrate, a first nitride layer, a polarity inversion layer, a second nitride layer, and a third nitride layer. The first nitride layer is located on the substrate. The polarity inversion layer is located on a surface of the first nitride layer to convert a non-metallic polarity surface of the first nitride layer into a metallic polarity surface. The second nitride layer is located on the polarity inversion layer. The third nitride layer is located on the second nitride layer. The substrate, the first nitride layer, the polarity inversion layer, and the second nitride layer include iron element.

In an embodiment of the disclosure, the third nitride layer includes iron element.

In an embodiment of the disclosure, the substrate includes a lower base and an upper base between the lower base and the first nitride layer. A thickness of the upper base is 25 μm to 200 μm.

In an embodiment of the disclosure, an oxygen concentration in the upper base is lower than an oxygen concentration in the lower base.

In an embodiment of the disclosure, a resistivity of the upper base is higher than a resistivity of the lower base.

In an embodiment of the disclosure, an iron concentration in the upper base is higher than an iron concentration in the lower base.

In an embodiment of the disclosure, in the upper base, an aluminum concentration within a depth of 2 μm below an interface between the upper base and the first nitride layer is less than 1E17 #/cm$^3$.

In an embodiment of the disclosure, in the upper base, an iron concentration within a depth of 2 μm below an interface between the upper base and the first nitride layer is greater than 1E14 #/cm$^3$.

In an embodiment of the disclosure, the first nitride layer includes aluminum silicon nitride including iron element, and an iron concentration in the first nitride layer is greater than 5E16 #/cm$^3$.

In an embodiment of the disclosure, the polarity inversion layer includes a metal layer including iron element, and an iron concentration in the polarity inversion layer is greater than 5E17 #/cm$^3$.

In an embodiment of the disclosure, the second nitride layer includes aluminum nitride including iron element, and an iron concentration in the second nitride layer is greater than 5E17 #/cm$^3$.

In an embodiment of the disclosure, the second nitride layer includes a low temperature nitrogen aluminum nitride layer and a high temperature nitrogen aluminum nitride layer located on the low temperature nitrogen aluminum nitride layer. A temperature difference between a growth temperature of the high temperature aluminum nitride layer and a growth temperature of the low temperature aluminum nitride layer is greater than about 50° C.

In an embodiment of the disclosure, a carrier concentration within a surface of the substrate is below 1E15 #/cm$^3$.

The disclosure provides a semiconductor structure, which includes a substrate, a first nitride layer, a metal layer, a second nitride layer, and a third nitride layer. The first nitride layer is located on the substrate. The substrate includes a lower base and an upper base between the lower base and the first nitride layer. In the upper base, an aluminum concentration within a depth of 2 μm below an interface between the upper base and the first nitride layer is less than 1E17 #/cm$^3$, and an iron concentration within a depth of 2 μm below the interface between the upper base and the first nitride layer is greater than 1E14 #/cm$^3$. The metal layer is located on a surface of the first nitride layer to convert a non-metallic polarity surface of the first nitride layer into a metallic polarity surface. The second nitride layer is located on the metal layer. The third nitride layer is located on the second nitride layer. The substrate, the first nitride layer, the metal layer, and the second nitride layer include iron element.

Based on the above, the substrate, the first nitride layer, the polarity inversion layer, and the second nitride layer in the semiconductor structure of the disclosure include iron element. Therefore, iron element can generate a deep-level dopant in the above structure to suppress the generation of a parasitic channel.

DETAILED DESCRIPTION OF DISCLOSED EMBODIMENTS

Figure 1:
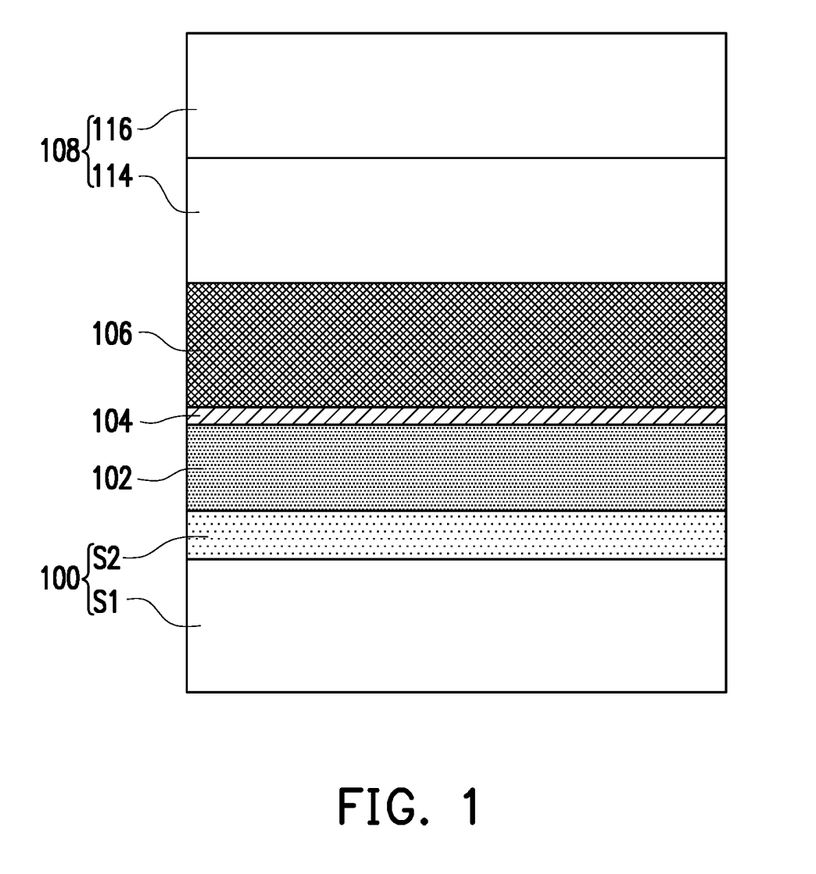
FIG. 1 is a schematic cross-sectional view of a semiconductor structure according to an embodiment of the disclosure.

FIG. 1 is a schematic cross-sectional view of a semiconductor structure according to an embodiment of the disclosure.

Please refer to FIG. 1. The semiconductor structure of the embodiment includes a substrate 100, a first nitride layer 102, a polarity inversion layer 104, a second nitride layer 106, and a third nitride layer 108.

The substrate 100 is, for example, a silicon substrate. In the embodiment, the substrate 100 includes a lower base S1 and an upper base S2 between the lower base S1 and the first nitride layer 102. The thickness of the upper base S2 is 25 μm to 200 μm, preferably 25 μm to 100 μm, and more preferably 45 μm to 55 μm. In the embodiment, the lower base S1 and the upper base S2 include different characteristics. For example, the flexural strength of the lower base S1 is higher than the flexural strength of the upper base S2, the oxygen concentration in the upper base S2 is lower than the oxygen concentration in the lower base S1, and the resistivity of the upper base S2 is higher than the resistivity of the lower base S1. In some embodiments, the flexural strength of the lower base S1 is 20 N to 200 N, thereby preventing the substrate 100 from being deformed during the process. In some embodiments, the oxygen concentration of the upper base S2 is less than 5 ppma, and the resistivity of the upper base S2 is greater than 1,000 ohm-cm.

In some embodiments, the upper base S2 and the lower base S1 are respectively formed by different processes, and the upper base S2 and the lower base S1 are then bonded or pressed together. In some embodiments, the method for forming the upper base S2 includes, for example, the magnetic field applied Czochralski (MCZ) method, the floating zone (FZ) method, or other methods, and the method for forming the lower base S1 includes, for example, the Czochralski (CZ) method or other methods. By combining the lower base S1 and the upper base S2 with different characteristics, the production cost of the semiconductor structure can be saved on the premise of maintaining the strength of the semiconductor structure and the yield of the subsequent thin film process.

In other embodiments, the lower base S1 is formed first, and the upper base S2 is then formed on the lower base S1 by a thin film deposition process. For example, the upper base S2 is formed on the lower base S1 by a chemical vapor deposition process.

In the embodiment, the substrate 100 includes iron element due to an unintentional method. In some embodiments, iron element is present in the upper base S2 and is selectively present in the lower base S1. The iron concentration in the upper base S2 is higher than the iron concentration in the lower base S1, wherein the lower base S1 selectively includes or does not include iron element. In some embodiments, in the upper base S2, the iron concentration within a depth of 2 μm below an interface between the upper base S2 and the first nitride layer 102 is greater than 1E14 #/cm$^3$, such as greater than 1E14 #/cm$^3$ and less than 1E19 #/cm$^3$, greater than 1E14 #/cm$^3$ and less than 1E18 #/cm$^3$, or greater than 1E14 #/cm$^3$ and less than 1E17 #/cm$^3$. When the iron concentration within a depth of 2 μm below the interface between the upper base S2 and the first nitride layer 102 is less than 1E14 #/cm$^3$, iron element in the substrate 100 does not have sufficient ability to suppress a parasitic channel. When the iron concentration within a depth of 2 μm below the interface between the upper base S2 and the first nitride layer 102 is greater than 1E19 #/cm$^3$, the GaN epitaxial surface is rough and the subsequent epitaxial quality will be damaged.

In some embodiments, the substrate 100 includes aluminum element due to an unintentional method. In some embodiments, in the upper base S2, the aluminum concentration within a depth of 2 μm below the interface between the upper base S2 and the first nitride layer 102 is less than 1E17 #/cm$^3$, such as less than 1E17 #/cm$^3$ and greater than 1E13 #/cm$^3$ or less than 1E16 #/cm$^3$ and greater than 1E13 #/cm$^3$. When the aluminum concentration within a depth of 2 μm below the interface between the upper base S2 and the first nitride layer 102 is greater than 1E17 #/cm$^3$, a parasitic channel is formed, so the smaller the aluminum concentration in the substrate 100, the better. In some embodiments, the carrier concentration within the surface of substrate 100 is below 1E15 #/cm$^3$.

The first nitride layer 102 is located on the substrate 100. For example, the first nitride layer 102 is directly formed on the substrate 100. The thickness of the first nitride layer 102 is between 0.1 nm and 5 nm, and preferably between 0.1 nm and 3 nm.

In the embodiment, the first nitride layer 102 includes iron element. For example, the first nitride layer 102 includes aluminum silicon nitride including iron element. The iron concentration in the first nitride layer is greater than 5E16 #/cm$^3$, such as greater than 5E16 #/cm$^3$ and less than 1E19 #/cm$^3$, greater than 5E16 #/cm$^3$ and less than 1E18 #/cm$^3$, or greater than 5E16 #/cm$^3$ and less than 1E17 #/cm$^3$. In some embodiments, the method for forming the first nitride layer 102 includes generating silicon nitride on the substrate 100, and then diffusing aluminum element and iron element in the polarity inversion layer 104 and the second nitride layer 106 into the silicon nitride, so as to form the aluminum silicon nitride including iron element, that is, the first nitride layer 102.

Please continue to refer to FIG. 1. The polarity inversion layer 104 is located on the surface of the first nitride layer 102. For example, the polarity inversion layer 104 is directly formed on the surface of the first nitride layer 102, and converts a non-metallic polarity surface of the first nitride layer 102 into a metallic polarity surface. In some embodiments, the thickness of the polarity inversion layer 104 is less than about 1 nm, and preferably less than 0.8 nm, such as 0.7 nm, 0.6 nm, 0.5 nm, 0.4 nm, etc. In some embodiments, metal element in the polarity inversion layer 104 is diffused into the first nitride layer 102, and the non-metallic polarity surface of the first nitride layer 102 is converted into a metallic polarity surface, so as to increase the surface flatness of the subsequently grown nitride layer.

In some embodiments, the polarity inversion layer 104 is a metal layer. For example, the method for forming the polarity inversion layer 104 includes directly depositing a metal material on the surface of the first nitride layer 102. In some embodiments, the polarity inversion layer 104 includes a metal layer including iron element. For example, the polarity inversion layer 104 includes iron element and other metal elements such as aluminum, indium, and gallium. In some embodiments, the iron concentration in the polarity inversion layer 104 is greater than 5E17 #/cm$^3$, such as greater than 5E17 #/cm$^3$ and less than 1E19 #/cm$^3$. In the embodiment, iron element in the polarity inversion layer 104 is diffused into other film layers, such as into the substrate 100 during the deposition of the polarity inversion layer 104 or during the subsequent heat treatment process, so as to generate a deep-level dopant to suppress the generation of a parasitic channel.

In some embodiments, iron element in the polarity inversion layer 104 is diffused into the first nitride layer 102 and into the substrate 100. In other words, before depositing the polarity inversion layer 104, the first nitride layer 102 and the substrate 100 do not include iron element, but the disclosure is not limited thereto. In other embodiments, before forming the polarity inversion layer 104, the first nitride layer 102 and the substrate 100 include iron element. For example, the first nitride layer 102 including iron element is directly deposited on the substrate 100.

Please continue to refer to FIG. 1. The second nitride layer 106 is located on the polarity inversion layer 104, and the third nitride layer 108 is located on the second nitride layer 106. In an embodiment, the second nitride layer 106 may be a single layer or multiple layers of aluminum nitride. In an embodiment, the thickness of the second nitride layer 106 is less than 100 nm, and preferably less than 50 nm, such as less than 25 nm.

In the embodiment, the second nitride layer 106 includes iron element. For example, the second nitride layer 106 includes aluminum nitride including iron element, and the iron concentration in the second nitride layer 106 is greater than 5E17 #/cm$^3$, such as greater than 5E17 #/cm$^3$ and less than 1E19 #/cm$^3$, greater than 8E17 #/cm$^3$ and less than 1E19 #/cm$^3$, or greater than 1E18 #/cm$^3$ and less than 1E19 #/cm$^3$. In some embodiments, iron element in the second nitride layer 106 comes from the polarity inversion layer 104, but the disclosure is not limited thereto. In other embodiments, the second nitride layer 106 including iron element is directly deposited on the polarity inversion layer 104.

The third nitride layer 108 includes a multi-layer structure, and the thickness of the third nitride layer 108 is, for example, between 0.1 μm and 10 μm, and preferably between 1 μm and 8 μm. In the embodiment, the third nitride layer 108 includes all combinations of aluminum gallium nitride, aluminum nitride, and gallium nitride. For example, the third nitride layer 108 of FIG. 1 is a combination of an aluminum gallium nitride layer 114 and a gallium nitride layer 116, wherein the gallium concentration of the aluminum gallium nitride layer 114 may be step increased or continuously increased from the second nitride layer 106 to the gallium nitride layer 116. However, the disclosure is not limited thereto. In other embodiments, the third nitride layer of the disclosure may further include a superlattice structure, a graded layer structure, an insertion layer structure, or a combination of the above structures.

In some embodiments, the third nitride layer 108 selectively includes iron element.

In the embodiment, the substrate 100, the first nitride layer 102, the polarity inversion layer 104, the second nitride layer 106, and the third nitride layer 108 include continuous or discontinuous iron element distribution. Specifically, "continuous iron element distribution" may mean that the entire film layer is a doped region with the same iron element concentration or the film layer includes doped regions with different iron element concentrations that are connected together, wherein the doped regions with different iron element concentrations may be iron element doped regions with graded or non-graded concentrations. In addition, "discontinuous iron element distribution" means that the film layer includes regions without iron element and regions with iron element.

Figure 2:
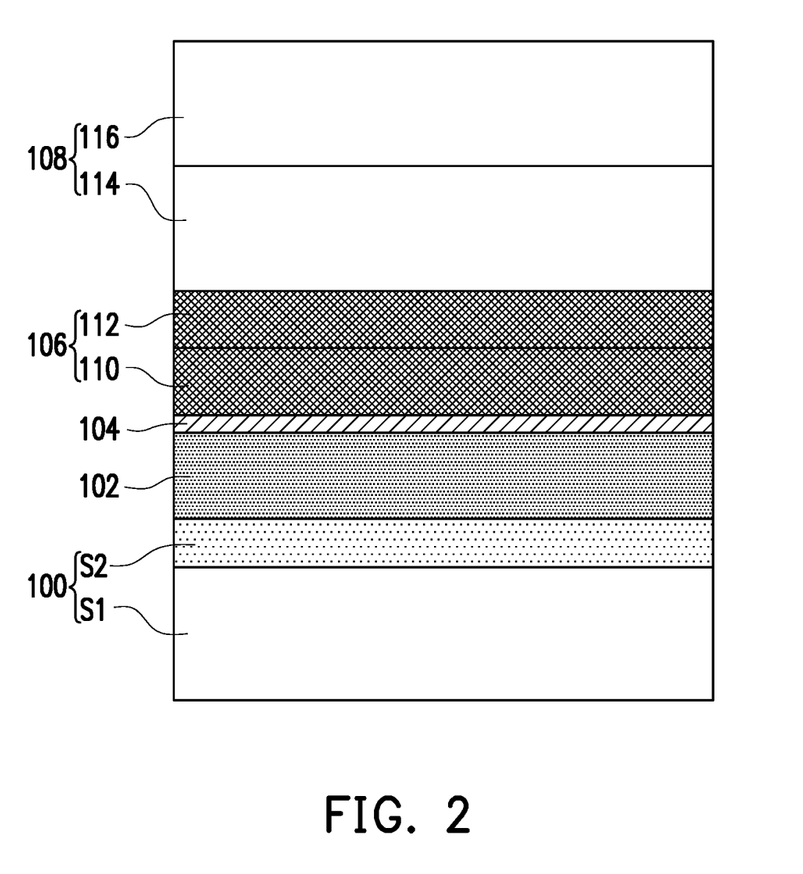
FIG. 2 is a schematic cross-sectional view of a semiconductor structure according to an embodiment of the disclosure.

FIG. 2 is a schematic cross-sectional view of a semiconductor structure according to an embodiment of the disclosure. It must be noted here that the embodiment of FIG. 2 continues to use the reference numerals and some content of the embodiment of FIG. 1, wherein the same or similar reference numerals are used to represent the same or similar elements, and the description of the same technical content is omitted. For the description of the omitted part, reference may be made to the above embodiment, which will not be repeated here.

The difference between the semiconductor structure of FIG. 2 and the semiconductor structure of FIG. 1 is that in the semiconductor structure of FIG. 2, the second nitride layer 106 is a double-layer structure and includes a first aluminum nitride layer 110 and a second aluminum nitride layer 112.

Please refer to FIG. 2. The first aluminum nitride layer 110 is located on the polarity inversion layer 104, and the second aluminum nitride layer 112 is located between the first aluminum nitride layer 110 and the third nitride layer 108. In the embodiment, from the viewpoint of suppressing insertion loss and interface carrier concentration, the first aluminum nitride layer 110 is preferably a low temperature aluminum nitride (LT AlN) layer, and the second aluminum nitride layer 112 is preferably a high temperature aluminum nitride (HT AlN) layer, wherein the temperature difference between the growth temperature of the high temperature aluminum nitride layer and the growth temperature of the low temperature aluminum nitride layer is greater than 50° C., and preferably greater than 100° C. In addition, in the embodiment, the use of the low temperature aluminum nitride layer can further suppress the generation of a parasitic channel.

In the embodiment, the thickness of the low temperature aluminum nitride layer is preferably smaller than the thickness of the high temperature aluminum nitride layer, wherein the thickness of the low temperature aluminum nitride layer is, for example, between 1 nm and 50 nm, and preferably between 5 nm and 25 nm; and the thickness of the high temperature aluminum nitride layer is, for example, between 1 nm and 50 nm, and preferably between 10 nm and 35 nm.

In the embodiment, the first aluminum nitride layer 110 and the second aluminum nitride layer 112 include continuous or discontinuous iron element distribution.

Figure 3:
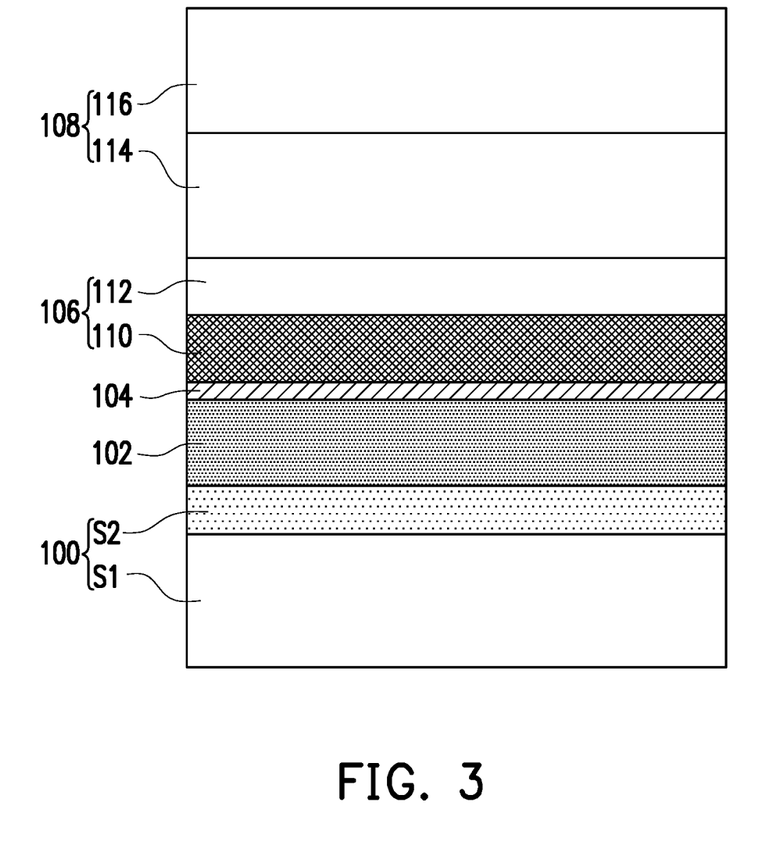
FIG. 3 is a schematic cross-sectional view of a semiconductor structure according to an embodiment of the disclosure.

FIG. 3 is a schematic cross-sectional view of a semiconductor structure according to an embodiment of the disclosure. It must be noted here that the embodiment of FIG. 3 continues to use the reference numerals and some content of the embodiment of FIG. 2, wherein the same or similar reference numerals are used to represent the same or similar elements, and the description of the same technical content is omitted. For the description of the omitted part, reference may be made to the above embodiments, which will not be repeated here.

The difference between the semiconductor structure of FIG. 3 and the semiconductor structure of FIG. 2 is that in the semiconductor structure of FIG. 3, the second aluminum nitride layer 112 and the third nitride layer 108 do not include iron element.

Please refer to FIG. 3. In some embodiments, the first aluminum nitride layer 110 is a low temperature aluminum nitride layer, and the second aluminum nitride layer 112 is a high temperature aluminum nitride layer, wherein the low temperature aluminum nitride layer includes iron element, and the high temperature aluminum nitride layer does not include iron element, but the disclosure is not limited thereto. In other embodiments, the first aluminum nitride layer 110 and the second aluminum nitride layer 112 are formed at the same process temperature (for example, are both high temperature aluminum nitride layers), wherein the first aluminum nitride layer 110 includes iron element, and the second aluminum nitride layer 112 does not include iron element.

Figure 4:
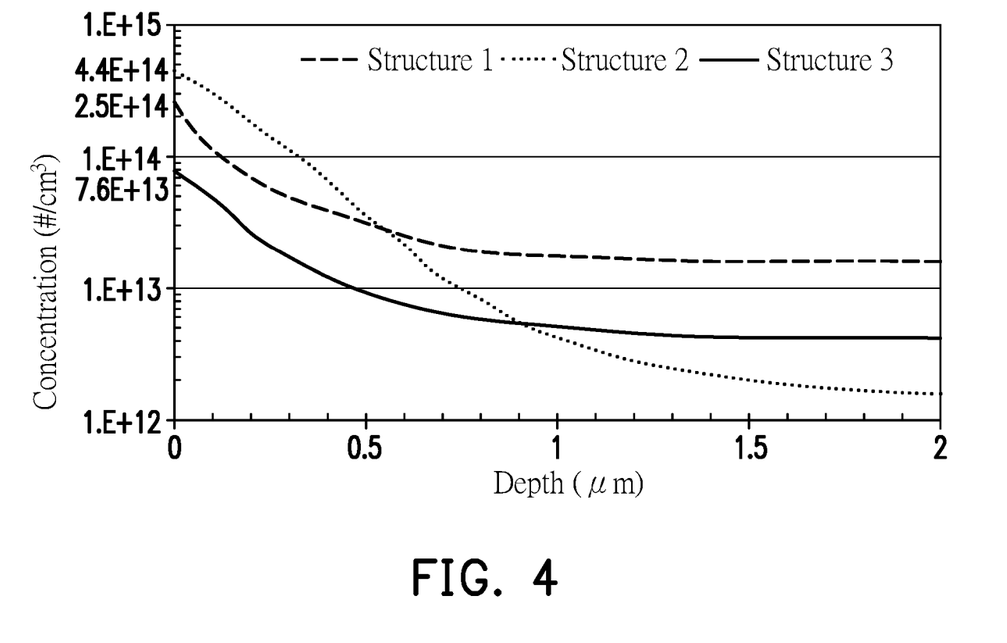
FIG. 4 is a graph of substrate carrier concentration and depth according to different structures.

FIG. 4 is a graph of substrate carrier concentration and depth according to different structures. In FIG. 4, the vertical axis represents the substrate carrier concentration, and the horizontal axis represents the depth.

FIG. 4 includes curves of the substrate carrier concentration and the depth of three different semiconductor structures. In FIG. 4, Structure 1 and Structure 2 are used to compare the effects brought by the embodiment of Structure 3, which does not mean that the disclosure is limited to the embodiment of Structure 3.

As shown in FIG. 2, Structure 1 includes the substrate 100 (silicon substrate), the first nitride layer 102 (aluminum silicon nitride), the polarity inversion layer 104, the second nitride layer 106 (including low temperature aluminum nitride and high temperature aluminum nitride), and the third nitride layer 108 from bottom to top. However, the difference from the previous description related to FIG. 2 is that the substrate 100, the first nitride layer 102, the polarity inversion layer 104, the second nitride layer 106, and the third nitride layer 108 in Structure 1 do not include iron element. It can be known from FIG. 4 that in Structure 1, the carrier concentration on the surface (depth of 0) of the substrate is 2.5E14 $\#/cm^3$.

Figure 5:
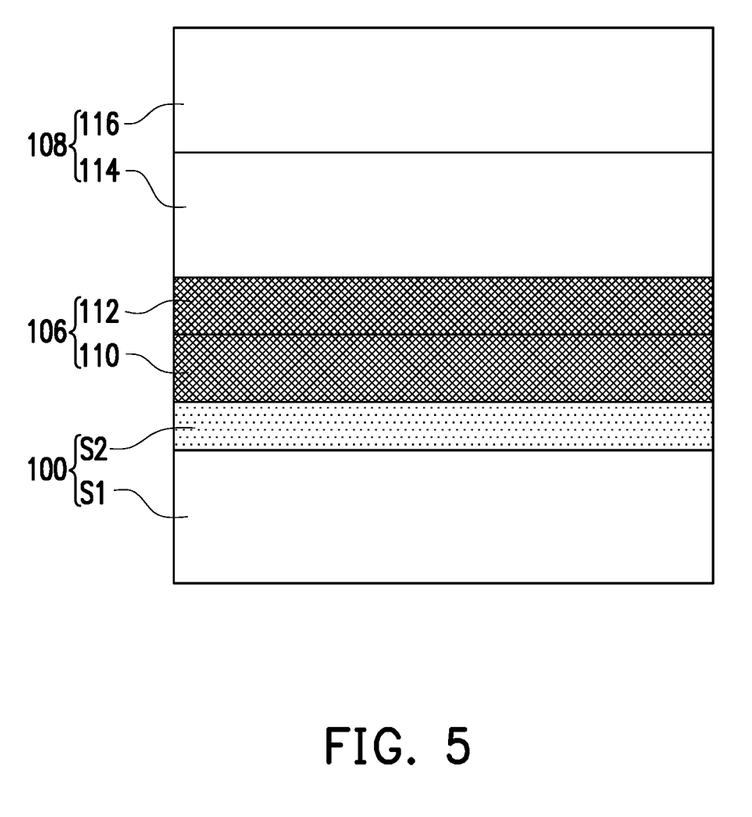
FIG. 5 is a schematic cross-sectional view of a semiconductor structure according to a comparative example of the disclosure.

As shown in FIG. 5, Structure 2 includes the substrate 100 (silicon substrate), the second nitride layer 106 (including low temperature aluminum nitride and high temperature aluminum nitride), and the third nitride layer 108 from bottom to top, wherein the difference between Structure 2 and Structure 1 is that Structure 2 does not have the first nitride layer 102 and the polarity inversion layer 104, and the silicon substrate and the second nitride layer 106 in Structure 2 include iron element. It can be known from FIG. 4 that in Structure 2, the carrier concentration on the surface (depth of 0) of the substrate is 4.4E14 $\#/cm^3$.

Still as shown in FIG. 2, Structure 3 includes the substrate 100 (silicon substrate), the first nitride layer 102 (aluminum silicon nitride), the polarity inversion layer 104, the second nitride layer 106 (including low temperature aluminum nitride and high temperature aluminum nitride), and the third nitride layer 108 from bottom to top, wherein the difference between Structure 3 and Structure 1 is that the substrate 100, the first nitride layer 102, the polarity inversion layer 104, and the second nitride layer 106 in Structure 3 include iron element.

As can be seen from FIG. 4, in Structure 3, in addition to using aluminum nitride to block the diffusion of aluminum element to the silicon substrate, the deep-level dopant formed by iron element may also be used to reduce the carrier concentration. Therefore, the carrier concentration on the surface of the silicon substrate in Structure 3 is lower than that of Structure 2 and Structure 1, so as to suppress the generation of a parasitic channel. In Structure 3, the carrier concentration within the surface of the substrate is below 1E15 $\#/cm^3$. Specifically, in Structure 3, the carrier concentration on the surface (depth of 0) of the substrate is 7.6E13 $\#/cm^3$, which is lower than the carrier concentration on the surface of the substrate of Structure 1 and Structure 2.

In summary, in the semiconductor structure of the disclosure, the substrate, the first nitride layer, the polarity inversion layer, and the second nitride layer include continuous or discontinuous iron element distribution, so that the generation of a parasitic channel can be suppressed through iron element. In addition, the second nitride layer formed by the low temperature nitrogen aluminum nitride layer and the high temperature nitrogen aluminum nitride layer can suppress the interface carrier concentration and reduce the insertion loss. The semiconductor structure of the disclosure may be used in the field of semiconductor epitaxy, and GaN on Si manufactured by the disclosure may be applied to a radio frequency (RF) element.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A semiconductor structure, comprising:
    a substrate;
    a first nitride layer, located on the substrate;
    a polarity inversion layer, located on a surface of the first nitride layer to convert a non-metallic polarity surface of the first nitride layer into a metallic polarity surface;
    a second nitride layer, located on the polarity inversion layer; and
    a third nitride layer, located on the second nitride layer, wherein the substrate, the first nitride layer, the polarity inversion layer, and the second nitride layer comprise iron element, the first nitride layer comprises aluminum silicon nitride comprising iron element, and an iron concentration in the first nitride layer is greater than 5E16 $\#/cm^3$.

2. The semiconductor structure according to claim 1, wherein the third nitride layer comprises iron element.

3. The semiconductor structure according to claim 1, wherein the substrate comprises:
    a lower base and an upper base between the lower base and the first nitride layer, wherein a thickness of the upper base is 25 µm to 200 µm.

4. The semiconductor structure according to claim 3, wherein an oxygen concentration in the upper base is lower than an oxygen concentration in the lower base.

5. The semiconductor structure according to claim 3, wherein a resistivity of the upper base is higher than a resistivity of the lower base.

6. The semiconductor structure according to claim 3, wherein an iron concentration in the upper base is higher than an iron concentration in the lower base.

7. The semiconductor structure according to claim 3, wherein in the upper base, an aluminum concentration within a depth of 2 µm below an interface between the upper base and the first nitride layer is less than 1E17 $\#/cm^3$.

8. The semiconductor structure according to claim 3, wherein in the upper base, an iron concentration within a depth of 2 µm below an interface between the upper base and the first nitride layer is greater than 1E14 $\#/cm^3$.

9. The semiconductor structure according to claim 1, wherein the polarity inversion layer comprises a metal layer comprising iron element, and an iron concentration in the polarity inversion layer is greater than 5E17 $\#/cm^3$.

10. The semiconductor structure according to claim 1, wherein the second nitride layer comprises aluminum nitride comprising iron element, and an iron concentration in the second nitride layer is greater than 5E17 $\#/cm^3$.

11. The semiconductor structure according to claim 1, wherein the second nitride layer comprises a first aluminum nitride layer and a second aluminum nitride layer located on the first aluminum nitride layer, wherein a temperature difference between a growth temperature of the second aluminum nitride layer and a growth temperature of the first aluminum nitride layer is greater than 50° C.

12. The semiconductor structure according to claim 11, wherein the first aluminum nitride layer comprises iron element, and the second aluminum nitride layer does not comprise iron element.

13. The semiconductor structure according to claim 1, wherein a carrier concentration within a surface of the substrate is below 1E15 $\#/cm^3$.

14. A semiconductor structure, comprising:
  a substrate;
  a first nitride layer, located on the substrate, wherein the substrate comprises a lower base and an upper base between the lower base and the first nitride layer, wherein in the upper base, an aluminum concentration within a depth of 2 μm below an interface between the upper base and the first nitride layer is less than 1E17 $\#/cm^3$, and an iron concentration within a depth of 2 μm below the interface between the upper base and the first nitride layer is greater than 1E14 $\#/cm^3$;
  a metal layer, located on a surface of the first nitride layer to convert a non-metallic polarity surface of the first nitride layer into a metallic polarity surface;
  a second nitride layer, located on the metal layer; and
  a third nitride layer, located on the second nitride layer, wherein the substrate, the first nitride layer, the metal layer, and the second nitride layer comprise iron element.

* * * * *